United States Patent [19]

Miller

[11] 4,224,547
[45] Sep. 23, 1980

[54] ADJUSTING THE FREQUENCY OF PIEZOELECTRIC CRYSTAL DEVICES VIA FRACTURING THE CRYSTAL SURFACE

[75] Inventor: Anton J. Miller, Allentown, Pa.

[73] Assignee: Bell Telephone Laboratories, Incorporated, Murray Hill, N.J.

[21] Appl. No.: 16,114

[22] Filed: Feb. 28, 1979

[51] Int. Cl.³ .................... H01L 41/08; H01L 41/22
[52] U.S. Cl. ................................. 310/312; 310/361; 310/367; 29/25.35
[58] Field of Search ................... 310/312, 360, 361, 310/367, 368, 369; 29/25.35

[56] References Cited

U.S. PATENT DOCUMENTS

| 2,245,178 | 6/1941 | Bechmann | 310/312 X |
| 3,074,034 | 1/1963 | Crownover | 310/312 X |
| 3,717,778 | 2/1973 | Nagata et al. | 310/367 X |

Primary Examiner—Mark O. Budd
Attorney, Agent, or Firm—Lester H. Birnbaum

[57] ABSTRACT

A method which permits highly stable frequency adjustment of piezoelectric crystal devices to tight tolerances. Small fragments of the crystal (10) which resemble conchoidal shells (18) are removed from at least one surface (11) of the crystal plate by fracturing. In one example, this is accomplished by applying pressure from a sharp-pointed stylus (20) near the edge of the plate.

21 Claims, 10 Drawing Figures

ADJUSTING THE FREQUENCY OF PIEZOELECTRIC CRYSTAL DEVICES VIA FRACTURING THE CRYSTAL SURFACE

BACKGROUND OF THE INVENTION

This invention relates to the fabrication of piezoelectric crystal devices, and in particular to a method of tuning the crystal to produce highly stable frequencies and a resulting product.

Piezoelectric crystal devices, especially those comprising quartz, are presently used in a variety of applications such as filters and oscillators. A significant step in the fabrication of such devices is tuning of the crystal to achieve a precise resonant frequency. The crystal is typically fabricated to a dimension which produces a resonant frequency less than the desired frequency and the frequency is then adjusted upward by reducing the frequency determining dimensions of the crystal. The techniques most widely used for removing quartz material involve abrasive removal such as sandblasting (abrasive jet machining) or grinding with abrasive paper. Although these techniques are adequate for most applications, they have two primary disadvantages. First, abrading causes a certain amount of surface damage to the crystal in the form of a dense arrangement of microcracks. Such damage causes strains in the crystal which usually result in frequency instability and higher motional resistance. Further, abrasive removal usually leaves some contamination on the surface of the crystal which in turn requires additional cleaning steps after the initial tuning. These effects often require repeated frequency tuning, and a frequency within tight tolerances is difficult to obtain. In addition, the frequency of the crystal may change after it has been mounted in a carrier. At this point, abrasive removal becomes impractical and the devices are typically tuned by adding mass to the electrodes on the plate. This process can be expensive or impractical however, since metal deposition is usually performed by evaporation in a vacuum, or by electroplating with a plating solution which can cause frequency instability therefore requiring subsequent stabilzation steps.

It is therefore a primary object of the invention to provide a means for adjusting the resonant frequency of crystal plates so that the frequency is highly stable. It is a further object of the invention to provide a means which permits adjustment of frequency within tight tolerances. A yet further object of the invention is to provide a convenient means for adjusting the frequency of the crystal after its incorporation into a device structure.

SUMMARY OF THE INVENTION

These and other objects are achieved in accordance with the invention. The invention is a method of fabricating piezoelectric crystal devices including adjusting the frequency of a crystal plate having major and minor surfaces involving removing a selected amount of material from the plate. The material is removed from a surface of the plate by fracturing the crystal near the edge between the major and minor surfaces. In accordance with one example, the crystal is fractured by applying a sharp-pointed stylus to the major surface resulting in the controlled removal of a small fragment from the minor surface resembling the shape of a conchoidal shell.

BRIEF DESCRIPTION OF THE DRAWING

These and other features of the invention are delineated in detail in the following description. In the drawing.

It will be appreciated that for purposes of illustration these figures are not necessarily drawn to scale.

DETAILED DESCRIPTION

Figure 1:
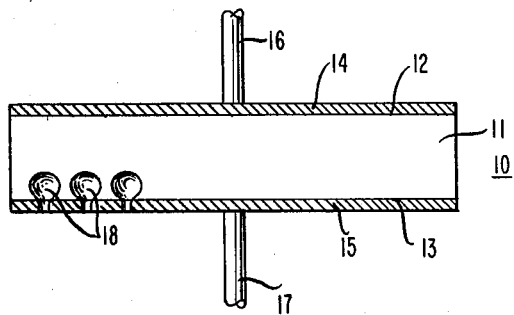
FIG. 1 is a side view of a quartz crystal device fabricated in accordance with one embodiment of the invention.

FIG. 1 illustrates a typical piezoelectric crystal device. It includes a piezoelectric quartz crystal plate, 10, which has major surfaces 12 and 13 defined by the length and width dimension and minor surfaces, one of which is shown as 11, defined by the length and thickness dimension. At least one electrode (14, 15) is formed on each of the major surfaces by vacuum evaporation to a thickness of approximately 1000 Angstroms. Leads (16, 17) are attached by soldering thereto for coupling to the desired circuit. The electrodes typically cover the entire major surfaces. The device shown may operate as an oscillator. If the electrodes are split, the device can function as a filter.

The crystal plate, 10, is typically fabricated by cutting a disc from a mother crystal in a particular crystal orientation to produce the desired vibrational mode. The crystal is then ground and lapped to produce a resonant frequency near the desired frequency for the final device. For extensional and face-shear mode crystals, the frequency will be determined by the length and width dimensions. For crystal plates operating in a flexural type mode, the frequency will be determined either by the length and width dimension alone (e.g., NT-cut or H-element free-free flexure or tuning fork), or by the length, width and thickness (e.g., X Y free-free flexure or tuning fork). Debris from the lapping operation is removed by etching to produce stress-free surfaces. This is done, typically, by immersing the plate in a 40% solution of HF for approximately 12 minutes. The electrodes are then plated onto the surfaces and the leads attached. The crystal is then ready to be tuned to the desired resonant frequency or the final device.

As stated previously, the usual prior art practice was to produce a crystal with dimensions which give a resonant frequency below the desired value and then to shorten the dimensions by abrasive removal so that the frequency is raised. In accordance with the present invention, the crystal plate can also be initially formed to give less than the desired frequency. However, with the technique described herein, the crystal can also be prepared initially above or below the desired frequency and then the frequency either raised or lowered as described in more detail below.

Figure 2:
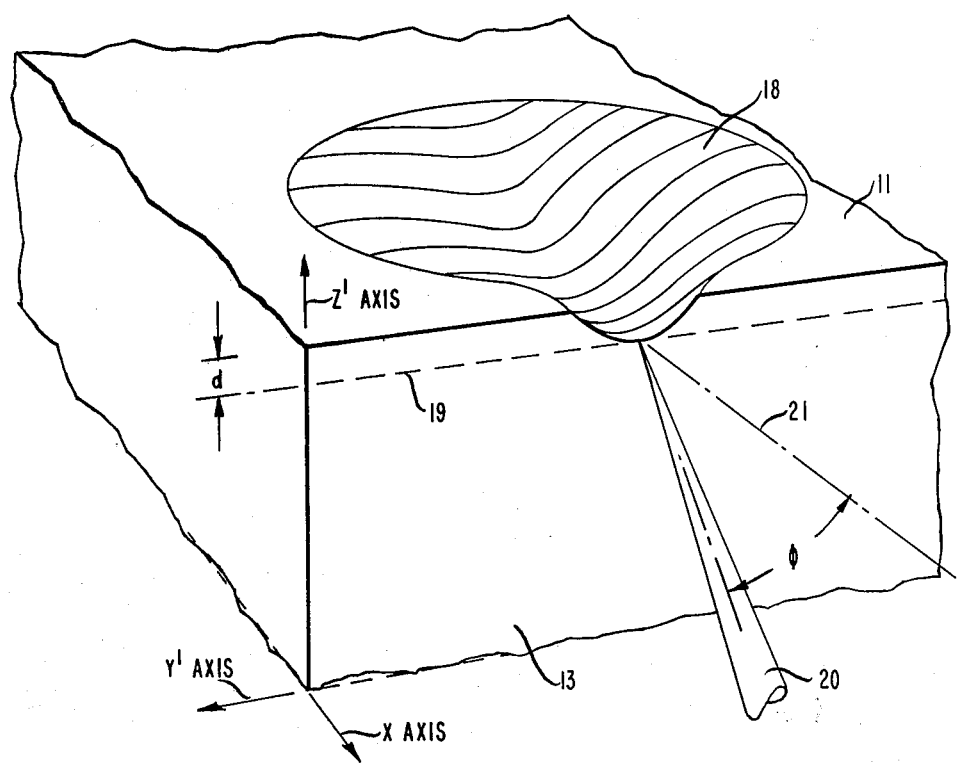
FIG. 2 is a perspective view of a portion of a crystal plate which illustrates one embodiment of the method of the invention.

In the present invention, the frequency of a crystal, which vibrates either in the extensional, face-shear or flexure mode, is adjusted by removing small chips of material selectively from either the major or minor surfaces by fracturing. This technique is illustrated in FIG. 2 which shows a portion of a quartz crystal with major and minor surfaces indicated with the same designation as in FIG. 1 (13 and 11 respectively).

In one example, the crystal was an extensional mode quartz plate having a length of 0.860 inches, a width of 0.157 inches and a thickness of 0.015 inches which was prepared in accordance with the standard techniques described above. Pressure was applied to a point on the major surface along a contact line, illustrated as dashed line 19, which was at a distance (d) approximately 0.002 inches from the edge between the major and minor surfaces. The pressure was applied manually with the sharp tip of a metal stylus, 20, held at an angle $\Psi$ of approximately 30 degrees relative to the normal to the plate surface, illustrated by dashed line 21. The normal of the major surface to which the pressure was applied coincides with the X axis of quartz. The pressure applied was approximatey 50 grams. (Actually, the pressure was applied to the electrode on the major surface which is not shown in FIG. 2. Since the electrodes are thin they can be ignored in terms of the fracturing phenomenum and effect on frequency. If desired, the electrodes can be formed so as to expose the area of crystal near the edges).

The application of sufficient pressure removed a small chip of the material primarily from the minor surface 11. The resulting fracture, 18, was in the shape of a conchoidal shell as indicated. Several fractures were produced along the surface and these were found to be highly uniform as to size and shape. Each conchoidal chip was approximately 0.012 inches in diameter and 0.002 inches deep. The fractures were also free of debris and secondary fractures.

The uniformity of chip removal resulted in uniform frequency changes at equal distances from the plate edges. By varying the pressure, distance, d, and angle $\Psi$, the size of the chip removed can be varied. For example, increasing the distance, d, will require a greater pressure to produce a fracture and will produce a larger area fracture, which in turn results in a larger frequency change. Pressures in the range of 20 grams to 100 grams have been found advantageous. One skilled in the art can easily determine precise parameters desired for his particular needs.

It will be noted that the consistency of chip removal is to some extent determined by the existence of surfaces free of damage. Thus, it is preferable that the surfaces be sufficiently etched prior to tuning as according to standard prior art techniques.

Although pressure has been applied manually by a sharp-pointed metal stylus, it should be clear that appropriate apparatus can be constructed to perform this function. Further, pressure can be applied by other means. For example, focusing a laser beam at the desired point of pressure should also produce the type of fracture shown in FIG. 2.

Figure 3:
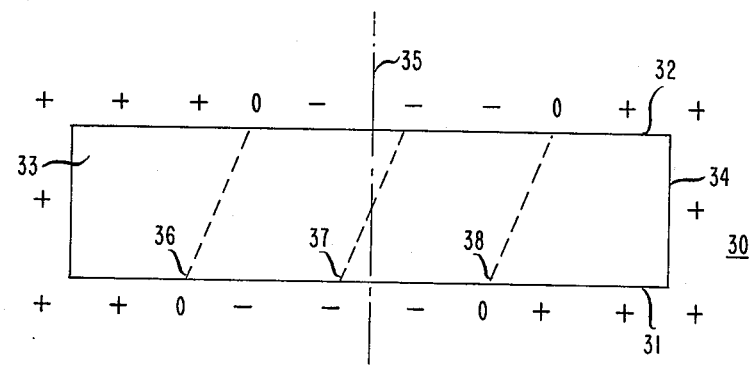
FIG. 3 is a plan view of an extensional mode crystal plate illustrating the effect of material removal on frequency at different areas of the surfaces in accordance with one embodiment of the invention.
Figure 4:
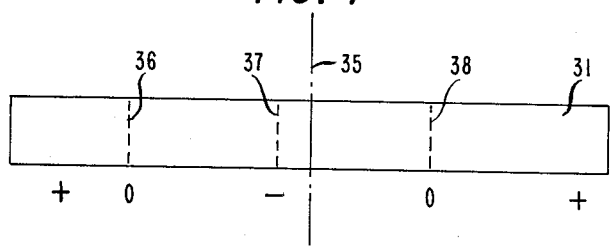
FIG. 4 is a side view of the extensional mode crystal of FIG. 3 also illustrating the effect of material removal of frequency at different areas of the surface.

The amount of frequency adjustment was also found to be dependent on the location of chip removal along the surface. By way of example, FIGS. 3 and 4 show a plan and side view, respectively, of an extensional mode crystal, 30, having a length of 0.860 inches, a width of 0.157 inches and a thickness of 0.015 inches. The figures illustrate areas along the minor surfaces (31 and 32) which exhibit no change in frequency (0), an increase in frequency (+) and a decrease in frequency (−) when material is selectively removed. It will be noted that areas of equal freqency change on opposite surfaces 31 and 32 are offset from lines parallel to the center line (35) by an angle $\theta$ of approximately 23 degrees as indicated by the diagonal lines 36–38.

Figure 5:
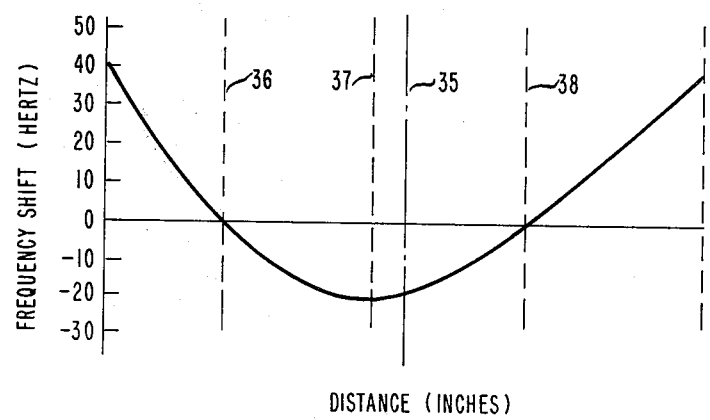
FIG. 5 is a graph of frequency change as a function of distance of material removal from the plate edge for an extensional mode crystal in accordance with the same embodiment of the invention.

FIG. 5 is a graph showing the amount of the frequency change for equal amounts of material removed as a function of distance from the plate edge along one minor surface (31) with the lines 35–38 superimposed thereon. Equal amounts of material were removed at each location by applying pressure from a metal stylus as previously described. Fractures having diameters of approximately 0.012 inches were produced. It will be realized that if larger frequency shifts are required, the size of chip removal can be increased by varying the pressure and/or the distance from the edge at which pressure is applied. Alternatively, several chips may be fractured in the same general area to increase the frequency shift.

It will be noted that the point of maximum decrease is slightly offset from the center line by a distance of approximately 0.033 inches. The points of zero change are located approximately 0.162 inches and 0.248 inches from the plate edge. Maximum increase occurs at the plate edge. It should be realized that the material can also be removed from the major surfaces at the locations indicated to produce the same frequency shifts.

Figure 6:
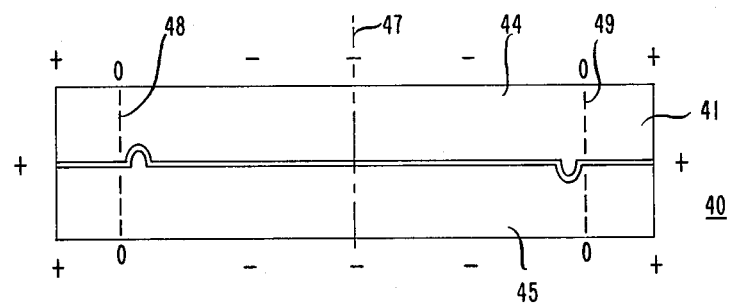
FIG. 6 is a plan view of a flexure mode crystal plate illustrating the effect of material removal on frequency at different areas of the surfaces in accordance with a further embodiment of the invention.
Figure 7:
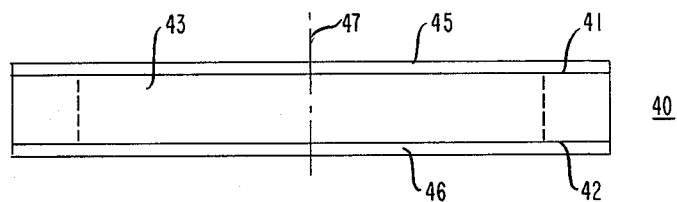
FIG. 7 is a side view of the flexure mode crystal of FIG. 6 also illustrating the effect of material removal on frequency at different areas of the surface.

The same crystal plate can also be operated in the flexure mode by an appropriate electrode geometry as well known in the art. Such a crystal plate, operated in the free-free flexure mode (known as an H element), with the same dimensions as the extensional mode plate previously described, was fractured in the manner previously indicated. FIGS. 6 and 7 show plan and side views, respectively, of such a plate. The plate 40, has major surfaces 41 and 42 and minor surfaces, one of which is shown as 43 in FIG. 7. Disposed on each major surface is a pair of electrodes, 44 and 45 of FIG. 6, which are arranged so as to give the proper geometry for flexure mode vibration (one of the pair 46, disposed on surface 42 is shown in FIG. 7). The electrodes, again, were deposited to a thickness of approximately 1,000 Angstroms.

FIGS. 6 and 7 show the effects of removal of chips by fracturing at various locations along the minor surfaces.

Figure 8:
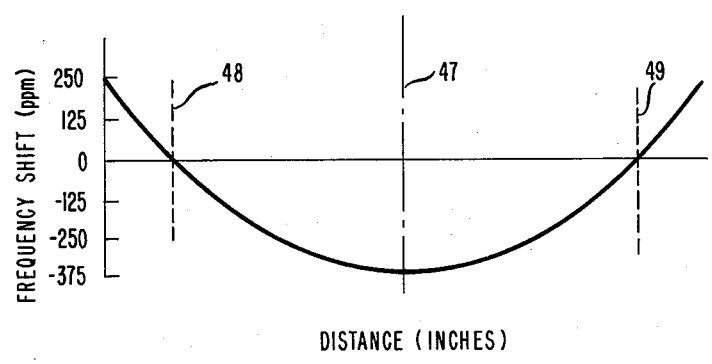
FIG. 8 is a graph of frequency change as a function of distance of material removal from the plate edge for a flexure mode crystal in accordance with the same embodiment of the invention.

Again, "0" indicates no change, "−" indicates a decrease, and "+" indicates an increase in frequency. FIG. 8 shows a graph of frequency shift as a function of distance of material removal from the plate edge where equal amounts were removed at each location. It will be noted that in this case the point of maximum decrease is at the center line 47, of the plate. The points of zero change indicated by lines 48 and 49 are located at distances of approximately 0.160 inches and 0.700 inches from the plate edge. These distances, which apply in this case to a width to length ratio of 0.182, correspond to distances of 0.186l from each edge of the crystal where l=the length of the crystal. For crystals with aspect ratios of 0.715 (8 KHz NT-cut crystals), the points of zero change are at 0.113l from each edge, and for crystals with aspect ratios of 0.257 (66 KHz H-element) the points of zero change are at 0.197l from each edge. Again, it should be realized that material can also be removed from the major surfaces at the locations indicated to produce the same frequency shifts. Similar results should also be obtained for XY type flexure mode crystal plates.

Frequency change has also been shown to be dependent on the location of material removal from faceshear mode crystals. The crystals were cut from a mother crystal at orientations of approximately 38 degrees or 52 degrees relative to the optic axis (CT and DT cuts, respectively), which are the standard cuts for face-shear mode crystals. The dimensions of length=0.260 inches, width=0.140 inches and thickness=0.019 inches were chosen to give nominal frequency of 845 KHz for CT cut crystals. Again, the crystal was etched, electrodes were deposited by vacuum evaporation on opposite major surfaces of the plate to thicknesses of approximately 1,000 Angstroms covering essentially the entire area of the major surfaces, and phosphor bronze leads were soldered therto to give the structure of FIG. 1. Material was selectively removed in the manner previously described for the extensional mode crystal, except that the stylus was held at an angle of approximately 20 degrees with respect to the normal to the major surface and the pressure applied was approximateky 40 grams.

Figure 9:
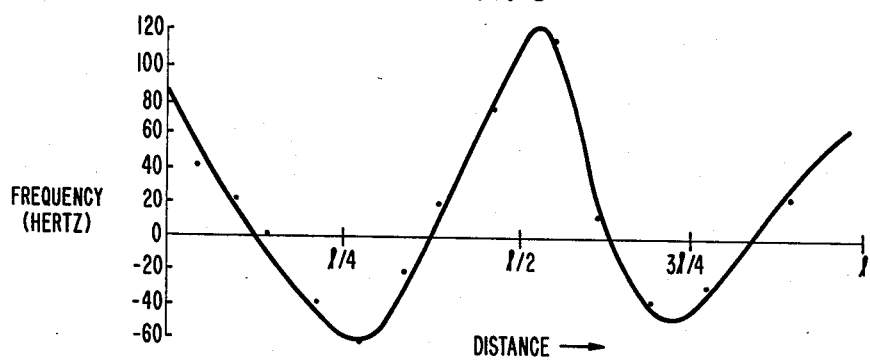
FIG. 9 is a graph of frequency change as a function of distance of material removal from the crystal plate edge for a face-shear mode crystal in accordance with a further embodiment of the invention.

FIG. 9 shows a graph of the frequency shift as a function of distance of material removal from the plate edge in terms of fractions of the crystal length, l. The amount of material removal from each location was essentially constant. It will be noted that the frequency will be decreased in this example, where the aspect ratio of the plate is approximately 0.540, if material is removed from the areas approximately 16–36% and 64–84% of the crystal length, with maximum decrease at the ¼ and ¾ length positions along the surface. The same curve is obtained for a DT cut crystal plate, but with a smaller frequency shaft at each location.

Figure 10:
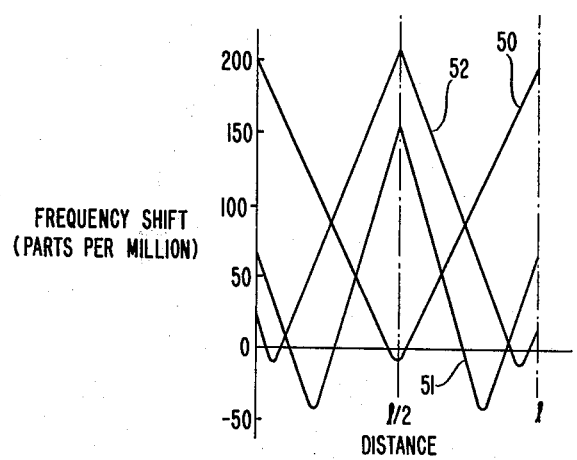
FIG. 10 is an approximate representation of frequency shift as a function of distance of material removal from the crystal plate edge for face-shear mode crystals having different aspect ratios in accordance with still further embodiments of the invention.

It was also discovered that the frequency shift characterization as a function of distance or mass removal from the plate edge will vary for face-shear mode crystals depending on the aspect ratio of the plate. FIG. 10 demonstrates the relative positions of frequency increase or decrease for three different aspect ratios of quartz crystal plates. Curve 50 represents an approximate frequency characteristic of a square plate, while curves 51 and 52 show the characteristics of plates having aspect ratios of 0.400 (DT cut in this example) and 0.135 (CT cut in this example), respectively. It will be noted that for a square plate, the frequency decreases only when material is removed at the center line of the plate. For a plate with an aspect ratio of 0.400, frequency decrease will occur if material is removed at a distance from the plate edge of 12–28% and 72–88% of the plate length. For a plate with an aspect ratio of 0.135, the frequency can be decreased if material is removed at a distance from the plate edge of 4–10% and 90–96% of the plate length. It should be appreciated that these curves are presented only to show the relative positions where a frequency increase or decrease can be obtained and the magnitude of the change was not measured.

Again, it should be appreciated that although material was removed primarily from the minor surfaces of the crystal in these examples of face-shear mode crystals, the material can also be removed from the major surfaces. The frequency shift as a function of the location of material removal from the major surfaces should have the same characteristics as those previously described for removal from the minor surfaces.

Several filters were fabricated from extensional mode crystal plates utilizing the technique of the present invention. The crystal plates were cut at an orientation of +5 degrees relative to the X axis to dimensions of length=0.860, width=0.157 and thickness=0.015 inches. The surfaces were etched by immersing the plate in either a 40% HF solution or an ammonium bifluoride solution saturated at 50 degrees C. to produce strain-free surfaces. The dimensions were chosen to produce a resonant frequency within ±30 Hz of a desired frequency of 130 KHz. Fractures were made while the frequency was monitored to bring the resonant frequency within ±5 Hz (±35 ppm) of the desired frequency. Typically, this involved producing approximately 3 fractures per crystal at various locations along one of the minor surfaces in the length dimension, although fractures in the minor surface in the width dimension can be employed. It appears that tolerances of ±1 Hz (±7 ppm) are feasible.

Several devices were subject to aging by baking at 100 degrees C. for several hours. No significant change in frequency were observed, indicating the highly stable adjustment produced by the fracturing technique.

Several oscillators were also fabricated from face-shear mode crystals. The crystals were either CT or DT cut quartz with typical dimensions of length=0.260 inches, width=0.1140 inches and thickness=0.019 inches. The crystals were also etched as described above. The CT-cut crystals were cut to dimensions in order to produce a frequency within ±100 Hz of a desired frequency of 845 Hz. The frequency was brought within ±10 Hz (±12 ppm) by fracturing in accordance with the invention. Typically, this involved making 2–4 fractures per crystal along one of the minor surfaces in the length dimension, although, again, fractures in the minor surfaces in the width dimension or in the major surfaces can be utilized. Frequency tolerances of ±5 Hz (±6 ppm) are attainable under production conditions.

Further, the fracturing technique was performed on several crystals after they had been mounted in carriers as part of miniature oscillator assemblies (which also include a hybrid circuit and an integrated circuit chip). Since the frequency of a crystal will often shift after mounting, the present invention is therefore useful for final adjustment, which cannot be done easily by usual prior art techniques.

As discussed above, the fracturing technique of the present invention can be used by itself to adjust a plate to attain the desired resonant frequency. In addition, the technique can be used for fine tuning after initial adjustments by prior art abrasive jet machining. Further, the technique may be employed for salvaging crystals which have been tuned over the desired frequency by prior art techniques.

It was discovered that the frequency of a crystal adjusted by the technique of the present invention is highly stable since a clean fracture is produced with no significant surface strain or damage. The need for temperature cycling and cleaning of surfaces for stability is eliminated. Further, the adjustment technique does not appear to contribute to the aging process of the devices. The invention appears to be most useful for fundamental extensional mode crystals in the frequency range of 40 to 500 KHz, fundamental face-shear mode crystals in the range of 50 KHz to 3 MHz, and fundamental flexure mode crystals in the range of 1 KHz to 150 KHz.

It should be clear, however, that the technique may be used for adjusting any multiple of the fundamental extensional, face-shear or flexure mode.

Although the invention has been described for adjusting quartz crystal plates, it should be apparent that other piezoelectric materials may be adjusted by the techniques described herein. In general, the invention may be employed on any single crystal piezoelectric material since all such materials have basically the same fracture characteristics. Typical materials are lithium niobate and lithium tantalate.

Various additional modifications will become apparent to those skilled in the art. All such variations which basically rely on the teachings through which the invention has advanced the art are properly considered within the spirit and scope of the invention.

I claim:

1. In a method for fabricating piezoelectric devices, a method for adjusting the resonant frequency of a single crystal piezoelectric plate (10) having major (12,13) and minor (11) surfaces comprising the step of removing a selected amount of material from said plate, CHARACTERIZED IN THAT material is removed in the form of a localized chip by fracturing the crystal near the edge between the major and minor surfaces.

2. The method according to claim 1 wherein the chip is removed substantially from a minor surface (11) of the crystal by applying pressure at a point on the adjacent major surface (13) a predetermined distance (d) from the edge between the major and minor surfaces.

3. The method according to claim 2 wherein the pressure is applied by a sharp-pointed instrument (20).

4. The method according to claim 1 wherein the chip is removed from an area of the crystal so as to decrease the frequency.

5. The method according to claim 1 wherein the crystal comprises quartz.

6. The method according to claim 1 wherein the crystal vibrates in the fundamental extensional mode and has a final resonant frequency in the range of 40 KHz to 500 KHz.

7. The method according to claim 1 wherein the crystal vibrates in the fundamental face-shear mode and has a final resonant frequency in the range of 50 KHz to 3 MHz.

8. The method according to claim 1 wherein the crystal vibrates in the fundamental flexure mode and has a final resonant frequency in the range 1 KHz to 150 KHz.

9. The method according to claim 6 wherein a plurality of chips are removed to bring the final resonant frequency within the range of ±35 parts per million of a predetermined desired frequency.

10. The method according to claim 7 wherein a plurality of chips are removed to bring the final resonant frequency within the range of ±12 parts per million of a predetermined desired frequency.

11. A method of adjusting the resonant frequency of a piezoelectric quartz crystal plate (10) having major (12,13) and minor (11) surfaces comprising the step of removing a selected amount of material from said plate CHARACTERIZED IN THAT the material is removed in the form of a localized chip from a selected area substantially at a minor surface (11) of the plate by applying pressure at a point on the adjacent major surface (13) a predetermined distance (d) from the edge between the major and minor surfaces.

12. The method according to claim 11 wherein the pressure is applied by a sharp-pointed instrument (20).

13. The method according to claim 11 wherein the crystal vibrates in the extensional mode and a plurality of chips are removed from the minor surface so as to adjust the final resonant frequency within ±35 ppm of a predetermined desired frequency.

14. The method according to claim 11 wherein the crystal vibrates in the face-shear mode and a plurality of chips are removed along the minor surface so as to adjust the frequency to within ±12 ppm of a predetermined desired frequency.

15. The method according to claim 11 wherein the chip is removed from an area of the minor surface so as to decrease the frequency of the crystal plate.

16. A piezoelectric device comprising a single crystal piezoelectric plate (10) having major (12,13) and minor (11) surfaces, and at least one pair of electrodes (14,15) disposed on opposite major surfaces of said plate, CHARACTERIZED IN THAT there is included on at least one surface of the crystal at least one localized area of fractured material in the shape of a conchoidal shell.

17. The device according to claim 16 wherein the fractured area is formed substantially in a minor surface.

18. The device according to claim 16 wherein the crystal comprises quartz.

19. The device according to claim 16 wherein the crystal vibrates in a fundamental extensional mode with a resonant frequency in the range of 40 KHz to 500 KHz.

20. The device according to claim 16 wherein the crystal vibrates in the fundamental face-shear mode with a resonant frequency in the range of 50 KHz to 3 MHz.

21. The device according to claim 16 wherein the crystal vibrates in the fundamental flexure mode with a resonant frequency in the range of 1 KHz to 150 KHz.

* * * * *

UNITED STATES PATENT AND TRADEMARK OFFICE
CERTIFICATE OF CORRECTION

PATENT NO. : 4,224,547
DATED : September 23, 1980
INVENTOR(S) : Anton J. Miller

It is certified that error appears in the above—identified patent and that said Letters Patent is hereby corrected as shown below:

Column 2, line 18, "of" should read --on--. Column 3, line 10, "or" should read --of--; line 43, "coincides" should read --coincided--. Column 5, line 12, "1" should read --$\ell$--; line 13, "1" should read --$\ell$--; line 14, "0.715" should read --0.0715--; line 15, "0.1131" should read --0.113$\ell$--; line 17, "0.1971" should read --0.197$\ell$--; line 45, "1" should read --$\ell$--; line 54, "shaft" should read --shift--; line 56, "or" should read --of--. Column 6, line 40, "were" should read --was--.

Signed and Sealed this

Tenth Day of March 1981

[SEAL]

Attest:

RENE D. TEGTMEYER

Attesting Officer     Acting Commissioner of Patents and Trademarks